United States Patent
Khemka et al.

(10) Patent No.: US 7,466,006 B2
(45) Date of Patent: Dec. 16, 2008

(54) STRUCTURE AND METHOD FOR RESURF DIODES WITH A CURRENT DIVERTER

(75) Inventors: Vishnu K. Khemka, Phoenix, AZ (US); Ronghua Zhu, Chandler, AZ (US); Amitava Bose, Tempe, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 416 days.

(21) Appl. No.: 11/134,792

(22) Filed: May 19, 2005

(65) Prior Publication Data

US 2006/0261382 A1 Nov. 23, 2006

(51) Int. Cl.
H01L 23/62 (2006.01)
(52) U.S. Cl. .................. 257/492; 257/493; 257/262; 257/343; 257/339
(58) Field of Classification Search ................ 257/262, 257/335, 339, 343, 345, 492, 493, 500, 141, 257/162
See application file for complete search history.

(56) References Cited

U.S. PATENT DOCUMENTS

| | | | | |
|---|---|---|---|---|
| 4,963,951 | A * | 10/1990 | Adler et al. | 257/141 |
| 5,773,852 | A * | 6/1998 | Han et al. | 257/139 |
| 5,801,431 | A * | 9/1998 | Ranjan | 257/659 |
| 5,959,332 | A * | 9/1999 | Ravanelli et al. | 257/360 |
| 6,100,549 | A | 8/2000 | Weitzel et al. | |
| 6,288,424 | B1 | 9/2001 | Ludikhuize | |
| 6,573,562 | B2 * | 6/2003 | Parthasarathy et al. | 257/338 |
| 6,693,339 | B1 * | 2/2004 | Khemka et al. | 257/492 |
| 6,747,332 | B2 | 6/2004 | De Frésart et al. | |
| 6,853,033 | B2 | 2/2005 | Liang et al. | |
| 6,882,023 | B2 | 4/2005 | Khemka et al. | |
| 6,888,210 | B2 | 5/2005 | Jeon et al. | |

(Continued)

OTHER PUBLICATIONS

R. Zhu et al., "Suppression of substrate injection by RESURF LDMOS devices in a smart power technology for 20-30v applications," IEEE BCTM 11.1, 1998, pp. 184-186.

(Continued)

Primary Examiner—Jerome Jackson
Assistant Examiner—Anthony Ho
(74) Attorney, Agent, or Firm—Ingrassia, Fisher & Lorenz, P.C.

(57) ABSTRACT

Methods and apparatus are provided for reducing substrate leakage current of lateral RESURF diode devices. The diode device (60, 60', 100) comprises first (39) and second (63) surface terminals overlying a semiconductor substrate (22) coupled to P (38, 32, 26) and N (24, 30, 46) type regions providing the diode action. An unavoidable parasitic vertical device (54, 92) permits leakage current to flow from the first terminal (39) to the substrate (22). This leakage current is reduced by having the diode device second terminal (63) comprise both N (46) and P (62) type regions coupled together by the second terminal (63). This forms a shorted base-collector lateral transistor (72) between the first (39) and second (63) terminals to provide the diode function. The gain of this lateral transistor (72) increases the proportion of first terminal (39) current that flows to the second terminal (63) rather than the substrate (22). In preferred embodiments, the first (39) or second (63) terminal is also ohmically coupled to a buried layer (24) that overlies the substrate (22) beneath the shorted base-collector lateral transistor (72).

15 Claims, 6 Drawing Sheets

U.S. PATENT DOCUMENTS

| | | |
|---|---|---|
| 6,909,143 B2 * | 6/2005 | Jeon et al. .................... 257/335 |
| 6,911,696 B2 * | 6/2005 | Denison ..................... 257/343 |
| 7,095,092 B2 * | 8/2006 | Zhu et al. ................... 257/506 |
| 2004/0084744 A1 * | 5/2004 | Khemka et al. ............. 257/492 |
| 2004/0195644 A1 * | 10/2004 | Mallikarjunaswamy et al. .. 257/491 |
| 2004/0238913 A1 * | 12/2004 | Kwon et al. ................ 257/492 |
| 2006/0246670 A1 * | 11/2006 | Khemka et al. ............. 438/285 |

OTHER PUBLICATIONS

Freescale Semiconductor, Inc. U.S. Appl. No. 10/836,170 filed on Apr. 30, 2004 entitled, "Semiconductor Device and Method of Forming the Same."

* cited by examiner

STRUCTURE AND METHOD FOR RESURF DIODES WITH A CURRENT DIVERTER

TECHNICAL FIELD

This invention generally relates to Smart Power integrated circuits and, more particularly, to means and methods for reducing substrate leakage currents associated with RESURF diodes employed in such integrated circuits.

BACKGROUND

There are many integrated circuit (IC) applications today in which a diode is formed by using a source region and gate terminal of a metal oxide semiconductor field effect transistor (MOSFET) shorted together forming an anode (or cathode), and what would ordinarily be the drain region of the MOSFET acting as the cathode (or anode) of the diode. Such structures are particularly useful in connection with RESURF devices. "RESURF" is an abbreviation standing for "reduced surface field." RESURF devices and method are described for example, in U.S. Pat. No. 6,882,023 B2 to Khemka et al and U.S. Pat. No. 6,747,332 B2 to de Fresart et al.

A known RESURF diode device is illustrated in FIG. 1, which shows a simplified schematic cross-section through double RESURF MOSFET diode device 20. RESURF MOSFET structures and methods are well known in the art and much used in power ICs. RESURF diode device 20 comprises P substrate 22, N-type buried layer (NBL) 24 overlying substrate 22, P-epi region 26 overlying NBL 24, P-buried region 28 typically implanted within P-epi region 26, N-well region 30 located between P-buried region 28 and surface 35, P-body region 32 extending into P-epi region 26 from surface 35 and laterally separated from N-well region 30 by channel region 27, N+ sinker region 34 extending from surface 35 through P-epi region 26 to NBL 24, N+ contact region 36 at surface 35 in N+ sinker region 34 for making contact to NBL 24 via N+ sinker region 34, P+ (e.g., anode) region 38 in P-body region 32 laterally separated from N+ contact region 36 by oxide (OX) isolation region 40, MOS gate 42 located over surface 35 above portion 33 of P-body region 32 extending laterally from P+ anode region 38 across channel region 27 and portion 31 of N-well region 30 and separated therefrom by thin gate oxide 43 on surface 35. Isolation oxide (OX) region 44 is provided vertically extending from surface 35 into N-well region 30 and laterally extending approximately from edge 42-1 of gate 42 to N+ cathode region 46 in N-well region 30 at surface 35. Connection 39 with lead 29 coupling P+ anode region 38 and gate 42 forms the anode contact of RESURF diode device 20 and connection 47 to N+ region 46 forms the cathode contact of RESURF diode device 20. Connection 41 is typically provided tying BL contact 37 to cathode connection 47.

FIG. 2 is simplified electrical equivalent circuit 50 of diode 20 of FIG. 1. Equivalent circuit 50 comprises PN diode 52 and PNP parasitic transistor 54 inherently present in RESURF diode device 20 of FIG. 1. PN diode 52 is provided by anode region 38 with contact 39 in P-body 32 and cathode region 46 with contact 47 in N-well 30. Parasitic PNP transistor 54 is provided by P-epi region 26, P-body 32 and contact region 38 that act as emitter 55; NBL 24 that acts as base 56; and P substrate 22 that acts as collector 57. Base 56 is coupled to cathode contact 47 via N+ sinker region 34, N+ contact region 36 and connection 41. While the arrangement of FIGS. 1-2 provides a convenient diode that is easily manufactured in connection with RESURF integrated circuits, it suffers from a number of well-known disadvantages. For example and not intended to be limiting, parasitic transistor 54 provides a leakage current path to substrate 22 as the forward bias across diode 52 is increased. This is undesirable and can degrade overall performance of the integrated circuit within which the diode of FIGS. 1-2 is incorporated. Thus, there continues to be a need for improved diodes that are process compatible with RESURF and other types of integrated circuits.

Accordingly, it is desirable to provide an improved integrated circuit diode structure and method that is compatible with integrated circuit technology, especially MOSFET integrated circuit technology and most particularly RESURF type MOSFETs. In addition, it is desirable that the improved diode structure and method be achievable with little or no change in established manufacturing processes, preferably, accomplished merely by modification of the masking layer(s) used for fabrication of the integrated circuits without having to add additional process steps. Furthermore, other desirable features and characteristics of the invention will become apparent from the subsequent detailed description and the appended claims, taken in conjunction with the accompanying drawings and the foregoing technical field and background.

BRIEF DESCRIPTION OF THE DRAWINGS

The invention will hereinafter be described in conjunction with the following drawing figures, wherein like numerals denote like elements.

DETAILED DESCRIPTION

Figure 1:
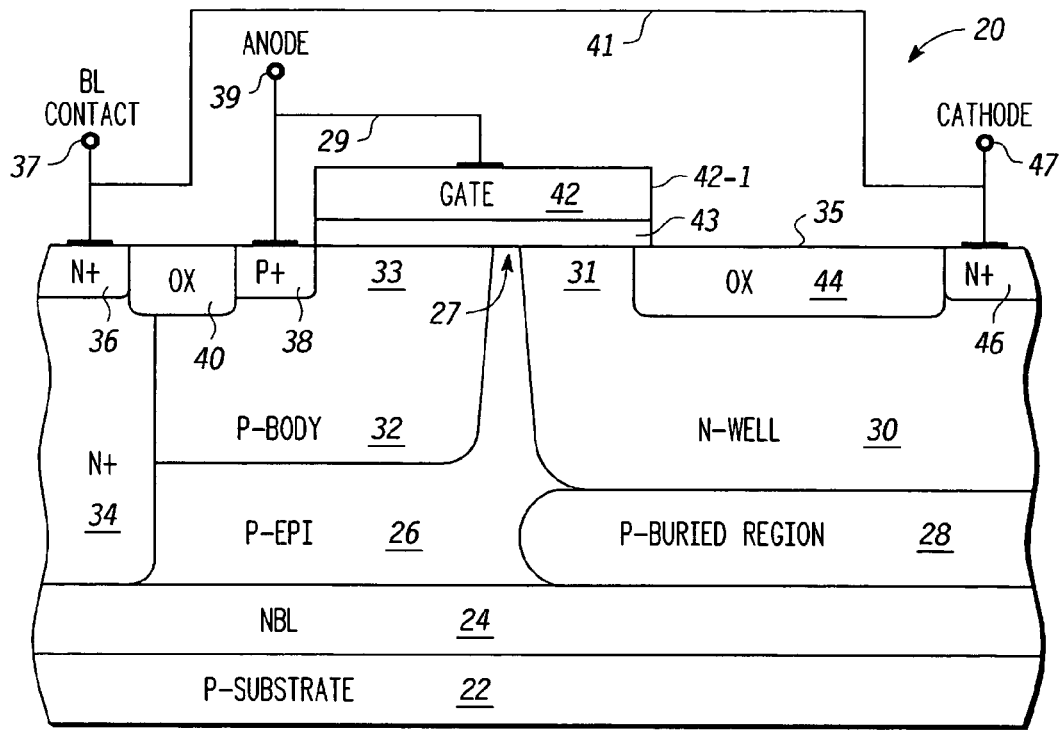
FIG. 1 is a simplified schematic cross-section through a known double RESURF diode device.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," right," "front," "back," "up," "down," "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner.

Figure 3:
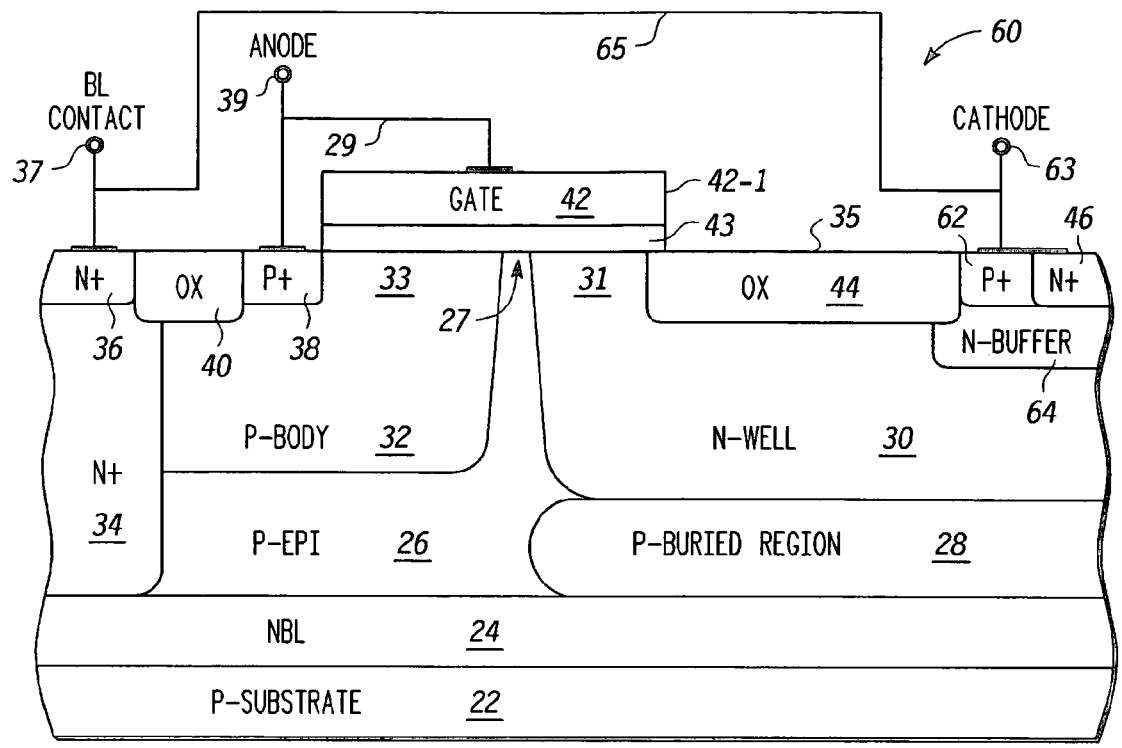
FIG. 3 is a simplified schematic cross-section through a RESURF diode device according to a first exemplary embodiment of the invention.

FIG. 3 is a simplified schematic cross-section through RESURF diode device 60 according to a first exemplary embodiment of the invention. Like reference numbers are used to identify analogous regions to those of diode device 20 of FIG. 1. RESURF diode device 60 comprises P substrate 22, N-type buried layer (NBL) 24 overlying substrate 22, P-epi region 26 overlying NBL 24, P-buried region 28 typically implanted within P-epi region 26, N-well region 30 located between P-buried region 28 and surface 35, P-body region 32 extending into P-epi region 26 from surface 35 and laterally separated from N-well region 30 by channel region 27, N+ sinker region 34 extending from surface 35 through P-epi region 26 to NBL 24, N+ contact region 36 at surface 35 in N+ sinker region 34 for making contact to NBL 24 via N+ sinker region 34, P+ (e.g., anode) region 38 in P-body region 32 laterally separated from N+ contact region 36 by oxide (OX) isolation region 40, MOS gate 42 located over surface 35 above portion 33 of P-body region 32 extending laterally substantially from P+ anode region 38 across channel region 27 and portion 31 of N-well region 30 and separated therefrom by thin gate oxide 43 on surface 35. Isolation oxide (OX) region 44 is provided extending downward from surface 35 into N-well region 30 and laterally extending approximately from edge 42-1 of gate 42 to P+ region 64 and N+ region 46 in N-well region 30 at surface 35. Connection 39 with lead 29 coupling P+ anode region 38 and gate 42 forms the anode contact of RESURF diode device 60. Connection 63 to P+ region 62 and N+ region 46 forms the cathode contact of RESURF diode device 60. Connection 63 ohmically couples P+ region 62 and N+ region 46. Connection 65, analogous to connection 41 of diode device 20, is desirably but not essentially provided to short N+ BL contact region 36 to cathode connection 63. Ohmic contacts are conveniently made to regions 36, 38, 46 and 62 using cobalt silicide, but other materials well known in the art may also be used. Various conductors, as for example and not intended to be limiting, Ti, TiN, W are applied to the cobalt-silicide ohmic contacts to form connection 63 and the other connections and interconnection (e.g., 21, 29, 37, 39, 41, 65). How to make ohmic contact to and provide connections to and interconnections between various regions of semiconductor devices is well known in the art.

Figure 2:
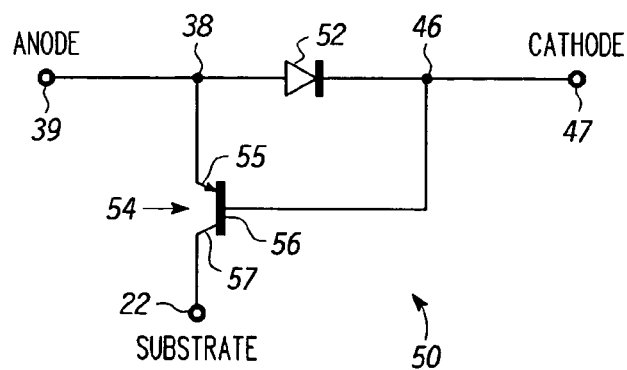
FIG. 2 is a simplified electrical equivalent circuit of the diode device of FIG. 1.

Device 60 of FIG. 3 differs from device 20 of FIG. 1 by inclusion of P+ region 62 adjacent to or in proximity of N+ region 46 and ohmically coupled thereto via connection 63. P+ region 62 coupled to N+ region 46 creates a base-collector shorted PNP device from anode 39 to cathode 63 (e.g., see FIG. 4). Since provision of P+ regions (e.g., by ion implantation) is already incorporated in the manufacturing process flow (e.g., for providing P+ region 38) only a mask layer change is needed to include P+ region 62 and no new process steps are required. Similarly, the cobalt silicide used for ohmic contact to regions 36, 38, 46 also serves to provide ohmic contact to region 62. Connection 63 provides a substantially shorting contact to both P+ region 62 and N+ region 46. This is also accomplished merely by a mask layer change without additional processing steps. While P+ region 62 is shown in FIG. 3 (and subsequent figures) as being located between N+ region 46 and oxide isolation region 44, this is merely for convenience of explanation and not intended to be limiting. The lateral arrangement of regions 62, 46 can be interchanged or they can be laterally separated provided that they are substantially shorted together by connection 63 so that diode 52 of FIGS. 1-2 is replaced by base-collector shorted PNP device 72 of FIGS. 3-4.

Figure 4:
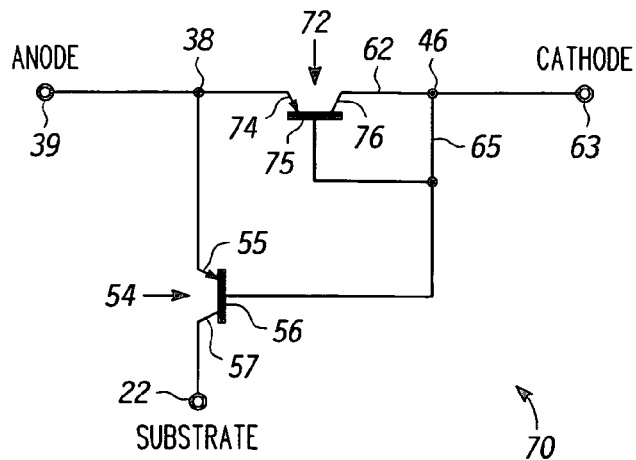
FIG. 4 is a simplified electrical equivalent circuit of the diode device of FIG. 3.

FIG. 4 is simplified electrical equivalent circuit 70 of diode device 60 of FIG. 3. Equivalent circuit 70 comprises parasitic PNP transistor 54 inherently present in RESURF diode device 60 (as it was in diode device 20), and shorted base-collector PNP device 72 extending between anode 39 and cathode 63. PNP device 72 comprises emitter 74 formed by P+ contact region 38, P-body 32 and P-epi region 26, base 75 formed by N-well region 30 and N+ contact region 46, and collector 76 formed by P+ region 62. With optional connection 65, base 75 is also formed by NBL 24, N+ sinker region 34 and N+ contact 36 coupled to N+ region 64. Connection 63 shorts base 75 and collector 76 together. The advantage of this arrangement over that of FIGS. 1-2 is that base-collector shorted device 72 has gain so that the current flowing from anode 39 to cathode 63 through device 72 for a given anode-cathode bias increases relative to the current flowing to substrate 22 through parasitic device 54 (e.g., see FIG. 1). Thus, the performance of diode device 60 of FIG. 2 is improved relative to prior art device 20 of FIG. 1.

Optional N-buffer region 64 is desirably provided in N-well 30 of device 60 underlying P+ region 62 and N+ region 46. N-buffer region 64 is conveniently doped more heavily than N-well region 30 and less heavily than N+ contact. N-buffer region 64 is desirable for punch-through mitigation or prevention. The inclusion of N-buffer region 64 may require an additional masking layer from the point of view of the device of FIG. 3 alone. However, an implant appropriate for providing N-buffer region 64 is often readily available in power IC technologies where it may be needed for other devices being manufactured on the same substrate at the same time as the invented device and can, therefore, be included for this device with only a mask layer modification and without an additional step in the overall process.

Figure 5:
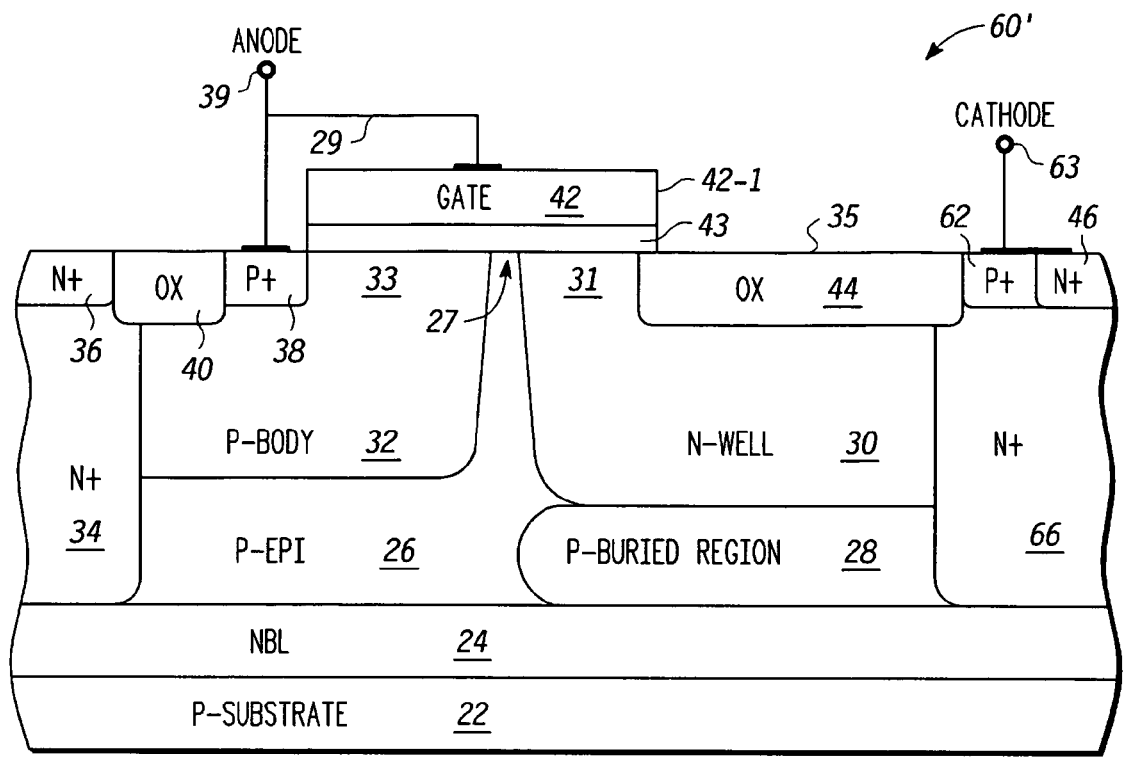
FIG. 5 is a simplified schematic cross-section through a RESURF diode device according to a further exemplary embodiment of the invention.
Figure 6:
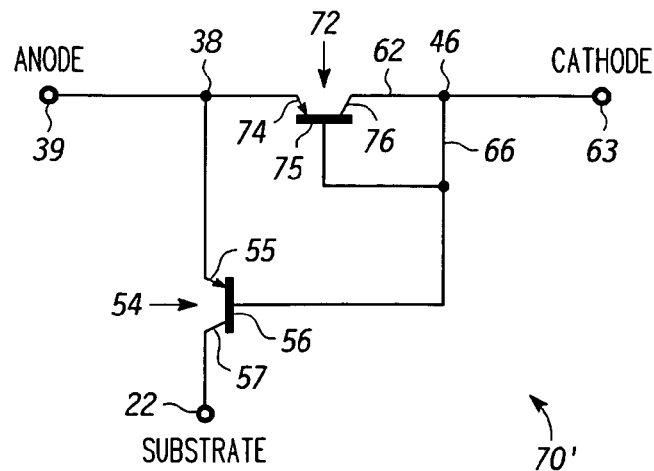
FIG. 6 is a simplified electrical equivalent circuit of the diode device of FIG. 5.

FIG. 5 is a simplified schematic cross-section through RESURF diode device 60' analogous to device 60 of FIG. 3 but according to a further exemplary embodiment of the invention and FIG. 6 is simplified electrical equivalent circuit 70' of the diode device of FIG. 5, analogous to equivalent circuit 70 of FIG. 4. Devices 60, 60' and equivalent circuits 70, 70' differ in that connection 65 of FIGS. 3-4 tying N+ BL contact region 36 to cathode regions 62, 46 is omitted and N+ sinker region 66 provided so that NBL 24 is tied to cathode regions 62, 46 via N+ sinker region 66 rather than via connection 65. The operation of diode device 60' and equivalent circuit 70' is substantially the same as for device 60 and circuit 70 with connection 65. The arrangement of FIGS. 5-6 is convenient in that connection 65 is not required. N+ sinker region 66 is conveniently provided at the same time as or in place of N+ sinker region 34 and only a mask change is needed. N-Buffer region 64 is conveniently omitted in the arrangement of FIG. 5 since N+ sinker 66 inherently provides punch-through protection. Additional chip area is not needed.

Figure 7:
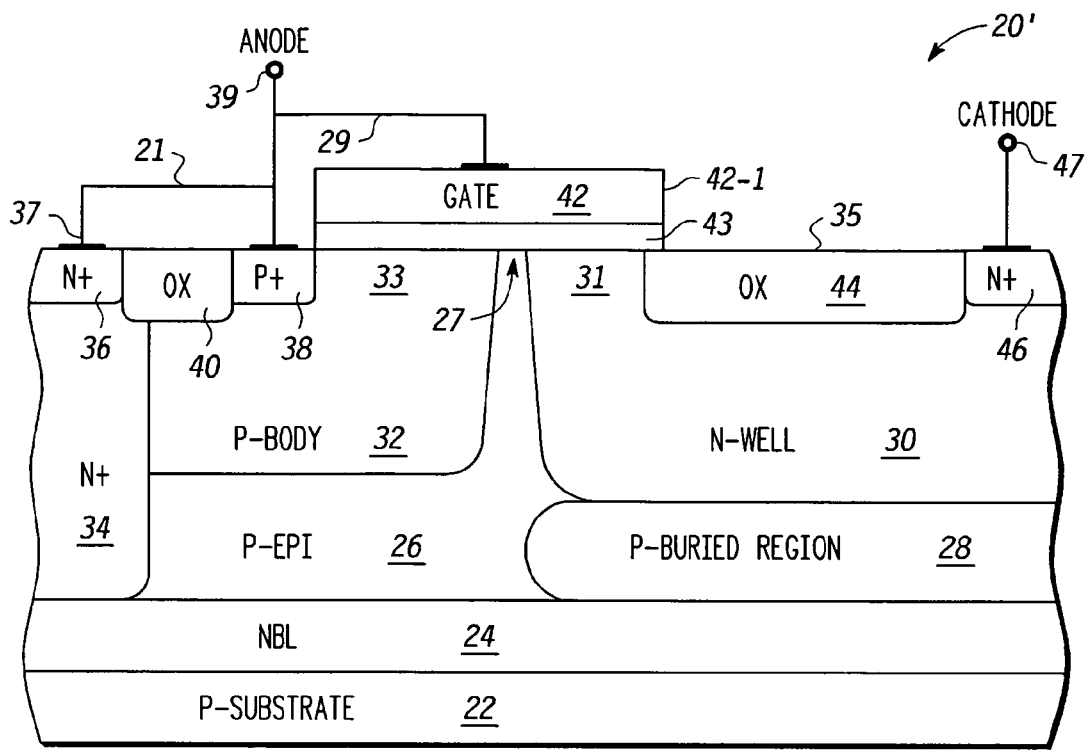
FIG. 7 is a simplified schematic cross-section through a further known RESURF diode device.
Figure 8:
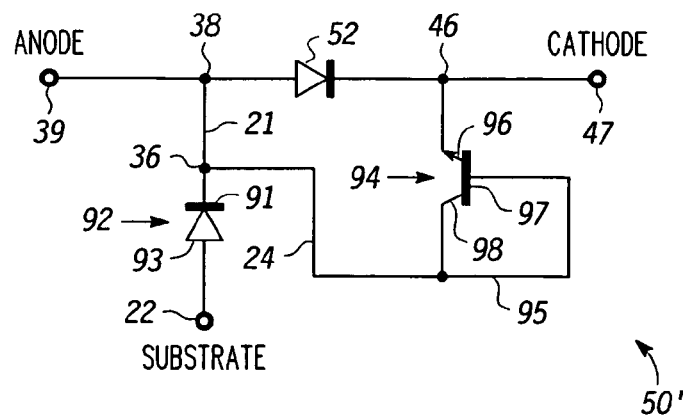
FIG. 8 is a simplified electrical equivalent circuit of the diode device of FIG. 7.

FIG. 7 is a simplified schematic cross-section through further prior art RESURF diode device 20' analogous to device 20 of FIG. 1 and FIG. 8 is simplified electrical equivalent circuit 50' of the diode device of FIG. 7, analogous to equivalent circuit 50 of FIG. 2. Diode device 20' of FIG. 7 differs from device 20 of FIG. 1 in that connection 21 is provided between P+ anode region 38 and N+ buried layer contact region 36 and connection 41 of FIG. 1 is omitted. This is, a configuration sometimes encountered in applications where lateral MOS diodes are needed. In other respects, the configuration of device 20' is substantially similar to the configuration of device 20. As shown by equivalent circuit 50' of FIG. 8, diode 52 exists between anode 39 and cathode 47 of device 20', just as for device 20. However, the presence of connection 21 shorting anode 39 comprising gate 42 and P+ region 38 to N-type BL 24 via N+ contact region 36 and N+ sinker region 34, has the effect of creating parasitic NPN transistor 94 between anode 39 and cathode 47. Emitter 96 is provided by N-well 30 and N+ region 46, base 97 is provided by P+ contact region 38, P-body region 32, P-epi region 26 and P-buried region 28, and collector 98 is provided by the combination of N-type BL 24, N+ sinker 34 and N+ region 36. The presence of parasitic NPN 94 causes a substantial part of the anode-cathode current to flow through buried layer 24. The voltage drop in buried layer 24 can turn on substrate diode 92, thereby increasing the leakage current to substrate 22. In the prior art, this problem has generally been mitigated by breaking up device 20' into several small sections with an isolation tie to N-type BL 24 disposed in between at regular intervals. This consumes additional device area resulting in increased die cost for the same performance. These limitations of the prior art configuration of FIGS. 7-8 may be avoided or mitigated by the arrangement according to the invention as shown in FIGS. 9-10.

Figure 9:
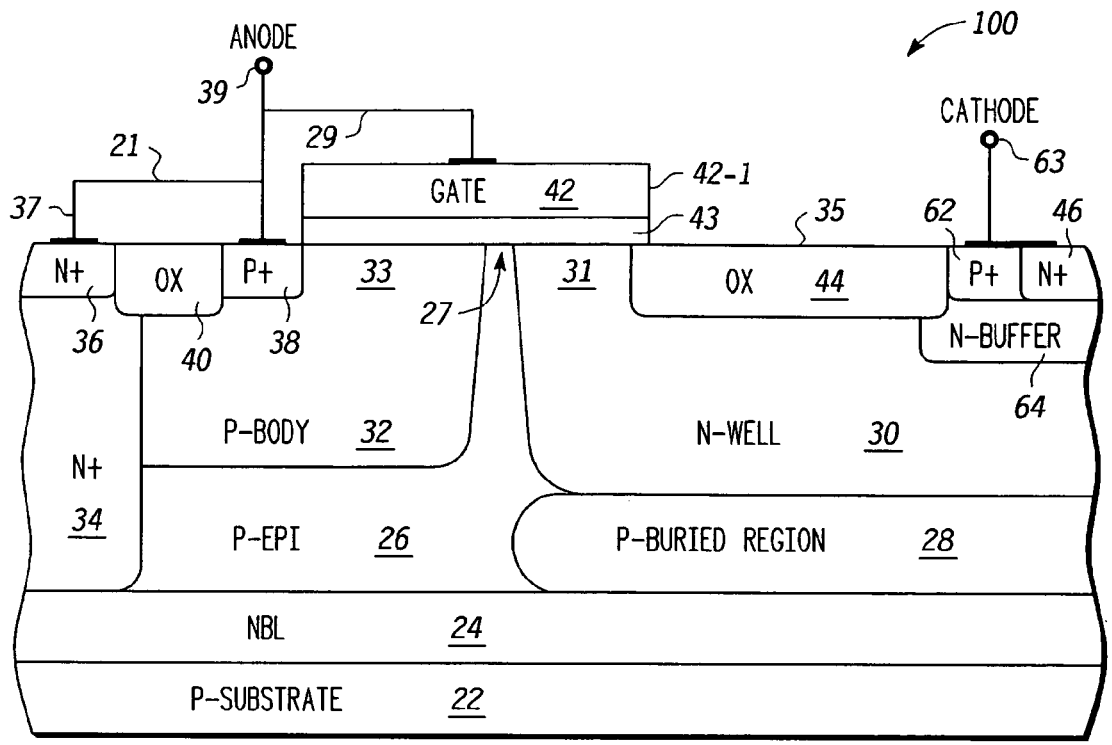
FIG. 9 is a simplified schematic cross-section through a RESURF diode device according to a still further exemplary embodiment of the invention.
Figure 10:
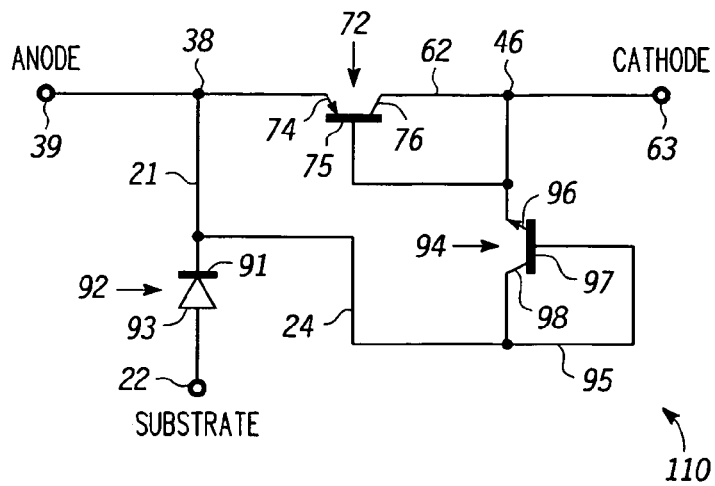
FIG. 10 is a simplified electrical equivalent circuit of the diode device of FIG. 9.

FIG. 9 is a simplified schematic cross-section through RESURF diode device 100 analogous to devices 60, 60' of FIGS. 3, 5 but according to a still further exemplary embodiment of the invention, and FIG. 10 is simplified electrical equivalent circuit 110 analogous to equivalent circuits 70. 70' of FIGS. 4, 6 but of the diode device of FIG. 9. Connection 21 between anode 39 and N+ buried layer contact region 36 is included in device 100, in the same manner as for device 20' of FIG. 7. As shown in FIG. 10, parasitic NPN transistor 94 exists for the same reason as explained in connection with equivalent circuit 50' of FIG. 8. Diode device 100 of FIG. 9 differs from device 20' of FIG. 8 in that P+ region 62 is included in N-well region 30 in the same manner as already described in connection with device 60 of FIG. 3. Optional N-buffer region 64 may also be included but this is not essential. As shown by equivalent circuit 110 of FIG. 10 and as previously explained in connection with the discussion of circuit 70 of FIG. 4, including P+ region 62 creates base-collector shorted PNP transistor 72 between anode 39 and cathode 63 in place of diode 52 of FIG. 8. The gain inherent in PNP transistor 72 increases the proportion of anode-cathode current that flows through device 72 relative to that flowing via parasitic NPN device 94, with the consequence that the biasing effect of the lateral voltage drop in N-type BL 24 is reduced and less current passes through diode 92 to substrate 22. Thus, the performance of RESURF diode device 100 is improved compared to otherwise equivalent prior art diode device 20'.

Figure 11:
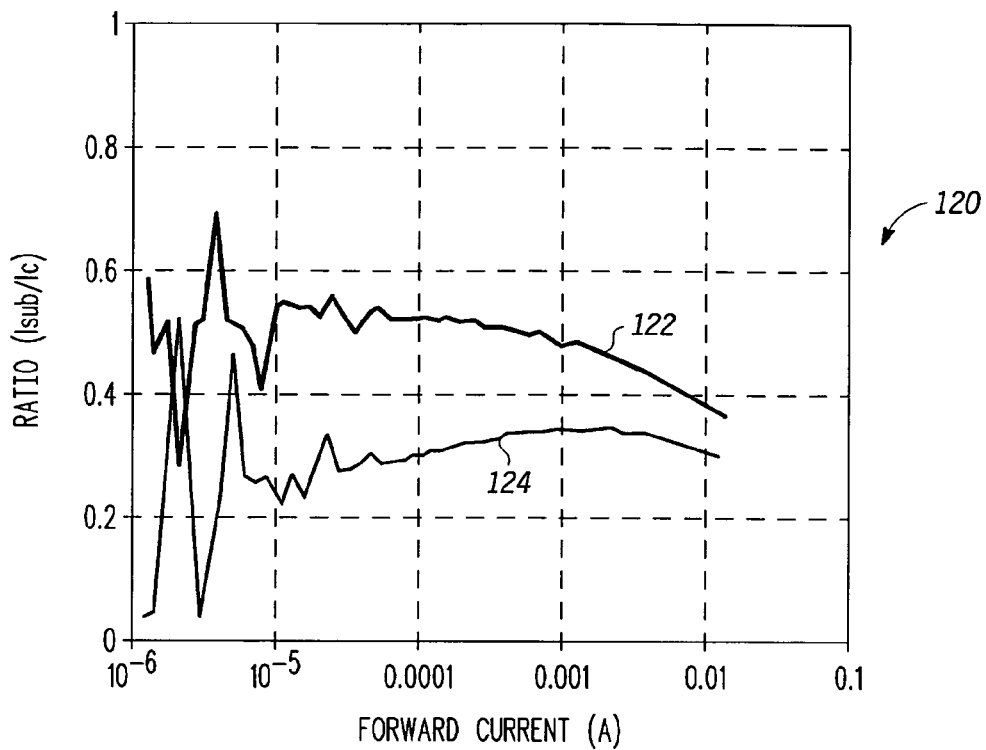
FIG. 11 shows plots as a function of forward current of the ratio of substrate current (Isub) to diode current (Ic) for diode devices of the prior art and the invention of the type illustrated in FIGS. 1 and 3.

FIG. 11 shows plot 120 as a function of forward current of the ratio of substrate current (Isub) to diode current (Ic) for diode devices of the prior art and of the invention. Trace 122 is the ratio (Isub)/(Ic) for a prior art device of the type illustrated in FIGS. 1-2 and trace 124 is the ratio (Isub)/(Ic) for a device according to the invention of the type illustrated in FIGS. 3-4 and 5-6. It will be noted that for substantially all values of forward current, the invented device has lower substrate current indicating that it significantly improves overall performance.

Figure 12:
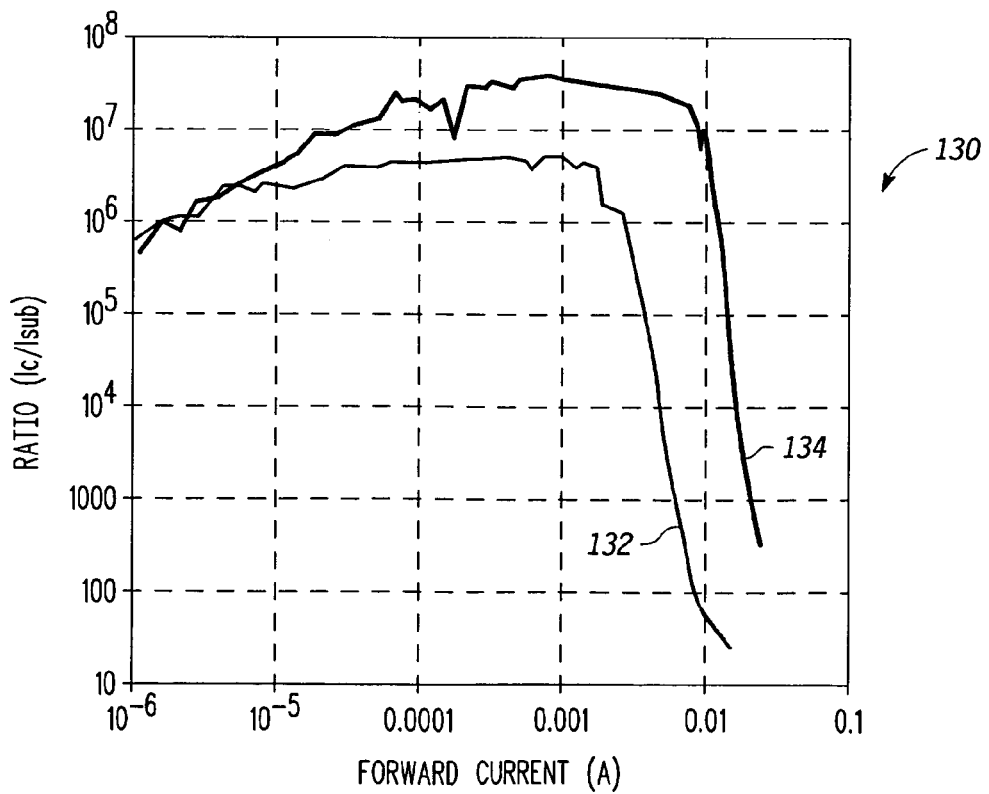
FIG. 12 shows plots as a function of forward current of the ratio of diode current (Ic) to substrate current (Isub) for diode devices of the prior art and the invention of the type illustrated in FIGS. 7 and 9.

FIG. 12 shows plot 130 as a function of forward current of the ratio of diode current (Ic) to substrate current (Isub) for diode devices of the prior art and the invention. Trace 132 is the ratio (Ic)/(Isub) for a prior art device of the type illustrated in FIGS. 7-8 and trace 134 is the ratio (Ic)/(Isub) for a device according to the invention of the type illustrated in FIGS. 9-10. It will be noted that for substantially all values of forward current, the invented device has higher diode current (lower substrate current) indicating that it significantly improves overall performance.

While the exemplary embodiments of invention have been described for a RESURF diode structure based on NMOSFET, this is merely for convenience of explanation and not intended to be limiting and the invention is also applicable to RESURF diode structures based on PMOSFET. For example, and not intended to be limiting, each N and P-type region may be replaced with its equivalent of opposite conductivity type, with corresponding changes in the polarity of applied voltages and equivalent circuit elements. The principles taught by the invention apply to such an arrangement. The invention provides an additional region of the appropriate conductivity type to create a collector-base shorted transistor functioning as or in place of the diode extending between anode and cathode, irrespective of whether the diode is a PN diode (as described above) or an NP diode obtained by swapping the N and P regions. Replacing the diode with a shorted base-collector transistor provides gain which increases the current flowing between anode and cathode relative to the parasitic current flowing into the substrate. It will also be apparent based on the description herein that the various device regions described herein and identified in various illustrative embodiments as being P-type and N-type regions may be more generally referred to as being regions of a first conductivity type and regions of a second conductivity type different than the first conductivity type, where such regions may be either N or P-type.

Stated another way and in more general terms, the invention provides the equivalent of a lateral diode device between first and second surface terminals on a semiconductor substrate where a vertical parasitic device also exists that permits leakage current to flow from the first terminal of the diode device to the substrate, which leakage current is reduced by having the second terminal of the diode device comprise both N and P type regions coupled together by the second terminal. This arrangement forms a shorted base-collector lateral transistor acting as the diode between the first and second terminals, which lateral transistor has gain, thereby increasing the proportion of the current entering the first terminal that flows to the second terminal. In a preferred embodiment, the second terminal is also coupled to a buried layer that overlies the substrate beneath the shorted base-collector lateral transistor, either by a surface lead to a buried layer contact or by providing a doped region of the same conductivity type as the buried layer extending between the N or P region of the second terminal and the buried layer. The invention also improves performance where the gate and the source-like contact of the diode device (e.g., its anode) is ohmically coupled to the buried layer contact.

There is provided a method of making a lateral diode function on a substrate of a first conductivity type, comprising, in any order, forming a buried layer of a second conductivity type different than the first conductivity type in contact with the substrate, depositing an epi layer of the first conductivity type located in contact with the buried layer and having a first surface opposite the buried layer, doping a body region of the first conductivity type in the epi-layer, doping a well region of the second conductivity type in the epi-layer laterally spaced apart from the body region by a channel region, providing a first contact region of the first conductivity type in the body region, providing a second contact region of the second conductivity type in the well region, providing a third contact region of the first conductivity type in the well region proximate the second contact region, forming a gate insulated from and overlying the surface and the channel region, making a first ohmic connection to the first contact region and the gate, and making a second ohmic connection to the second and third contact regions. In a preferred exemplary embodiment, the steps of providing the first and third contact regions are carried out substantially simultaneously. In a further exemplary embodiment, the method comprises providing a contact sinker through the epi-layer for making contact with the buried layer. A connection from the buried layer contact to either the first or second ohmic connections is desirably provided. The body region, well region, contact regions and sinker region are conveniently but not essentially provided by ion implantation. The buried layer may be formed by ion implantation or any other convenient means.

According to a first exemplary embodiment, there is provided a semiconductor device, comprising, a semiconductor substrate of a first conductivity type; first and second surface terminals laterally spaced-apart on a surface above the semiconductor substrate, a first semiconductor region of the first conductivity type overlying the substrate and ohmically coupled to the first terminal, a second semiconductor region of a second opposite conductivity type overlying the substrate ohmically coupled to the second terminal and laterally arranged with respect to the first semiconductor region, a parasitic vertical device comprising the first semiconductor region and the substrate, that permits leakage current to flow from the first terminal to the substrate, and a third semiconductor region of the first conductivity type in proximity to the second semiconductor region and ohmically coupled to the second terminal, thereby forming in combination with the second semiconductor region a shorted base-collector region of a lateral transistor extending between the first and second terminals to provide the diode action. In a further embodiment, the diode device further comprises a channel region of the first conductivity type separating the first and second regions at the surface, and a gate electrode overlying the channel region. In a still further embodiment, the gate electrode is ohmically coupled to the first terminal. In a yet further embodiment, the device further comprises a buried layer of the second conductivity type located between the substrate and the first, second and third semiconductor regions, and a buried layer contact region of the second conductivity type extending from the buried layer to the surface to permit electrical contact to the buried layer. In a yet still further embodiment, the device further comprises an ohmic connection extending between the second terminal and the buried layer contact region. In a still yet further embodiment, the device further comprises an ohmic connection extending between the first terminal and the buried layer contact region. In an additional embodiment, the device further comprises a buried layer of the second conductivity type located between the substrate and the first, second and third semiconductor regions, and a buried layer contact region of the second conductivity type extending from the buried layer to the second semiconductor region. In a yet additional embodiment, the device further comprises a fourth semiconductor region of the second conductivity type, more lightly doped than the second semiconductor region and underlying the second semiconductor region. In a still additional embodiment, the first region of the first semiconductor type comprises a first highly doped contact region ohmically coupled to the first terminal and a less highly doped body region of the first conductivity type underlying the first highly doped contact region, and the second region of the second semiconductor type comprises a second highly doped contact region ohimcally coupled to the second terminal and a less highly doped well region of the second conductivity type underlying the second highly doped contact region. In a yet still additional embodiment, the device further comprises a buffer region of the second conductivity type underlying the second highly doped contact region and extending into the well region, and more highly doped than the well region. In a still yet additional embodiment, the second region of the second semiconductor type comprises a second highly doped contact region ohimcally coupled to the second terminal and a less highly doped well region of the second conductivity type underlying the second highly doped contact region, and the device further comprising a buried region of the first conductivity type located between the buried layer and the well region.

According to a second exemplary embodiment, there is provided a lateral device for providing diode action on a semiconductor substrate of a first conductivity type, comprising, a buried layer of a second conductivity type different than the first conductivity type overlying the substrate, further semiconductor regions overlying the buried layer and having a surface spaced apart from the buried layer, a first contact region of the first conductivity type in the further semiconductor regions overlying the buried layer and extending to the surface, a second contact region of the second conductivity type in the further semiconductor regions overlying the buried later, laterally disposed with respect to the first contact region, and extending to the surface, a first terminal ohmically coupled to the first contact region, a second terminal ohmically coupled to the second contact region, a vertical parasitic device embodying the first contact region, a portion of the further semiconductor regions and the substrate, whereby the parasitic device is adapted to provides a leakage current path to the substrate from the first terminal when bias is applied between the first and second terminals, and wherein the device further comprises a third contact region of the first conductivity type in the further semiconductor regions in proximity to the second contact region and ohmically coupled thereto and to the second terminal, thereby forming in cooperation with the second contact region a shorted base-collector region of a lateral transistor extending between the first and second terminals and adapted to provide the diode action when bias is applied between the first and second terminals. In a further embodiment the further semiconductor regions comprises a body region of the first conductivity type including the first contact region, a well region of the second conductivity type including the second and third contact regions and laterally separated from the body region at the surface. In a still further embodiment the device further comprises a gate insulated from the surface, electrically coupled to the first terminal, and overlying a channel region separating the body region and the well region at the surface. In a yet further embodiment, the device further comprises a buried layer contact region of the same conductivity type as the buried layer, extending through the further semiconductor regions from the buried layer toward the surface. In a yet still further embodiment the buried layer contact region underlies and makes contact at least with the second contact region. In a still yet further embodiment, the device further comprises an ohmic connection located on or above the surface and coupling the buried layer contact region to the second contact region. In a yet still further embodiment, the device further comprises an ohmic connection located on or above the surface and coupling the buried layer contact region to the first contact.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A semiconductor device, comprising:
   a semiconductor substrate of a first conductivity type;
   first and second surface terminals laterally spaced-apart on a surface above the semiconductor substrate;
   a first semiconductor region of the first conductivity type overlying the substrate and ohmically coupled to the first terminal;
   a second semiconductor region of a second opposite conductivity type overlying the substrate ohmically coupled to the second terminal and laterally arranged with respect to the first semiconductor region;
   a parasitic vertical device comprising the first semiconductor region and the substrate;
   a channel region of the first conductivity type separating the first and second regions at the surface;
   a gate electrode overlying the channel region;
   an isolation region extending downward from the surface between an edge of the gate electrode and a third semiconductor region; and
   the third semiconductor region of the first conductivity type in proximity to the second semiconductor region and ohmically coupled to the second semiconductor region via the second terminal, thereby forming in combination with the second semiconductor region a shorted base-collector region of a lateral transistor extending between the first and second terminals.

2. The device of claim 1 wherein the gate electrode is ohmically coupled to the first terminal.

3. The device of claim 1, further comprising:
   a fourth semiconductor region of the second conductivity type, more lightly doped than the second semiconductor region and underlying the second semiconductor region.

4. The device of claim 1, further comprising:
   a buried layer of the second conductivity type located between the substrate and the first, second and third semiconductor regions; and
   a buried layer contact region of the second conductivity type extending from the buried layer to the second semiconductor region.

5. A semiconductor device, comprising:
   a semiconductor substrate of a first conductivity type;
   first and second surface terminals laterally spaced-apart on a surface above the semiconductor substrate;
   a first semiconductor region of the first conductivity type overlying the substrate and ohmically coupled to the first terminal;
   a second semiconductor region of a second opposite conductivity type overlying the substrate ohmically coupled to the second terminal and laterally arranged with respect to the first semiconductor region;
   a parasitic vertical device comprising the first semiconductor region and the substrate;
   a third semiconductor region of the first conductivity type in proximity to the second semiconductor region and ohmically coupled to the second terminal, thereby forming in combination with the second semiconductor region a shorted base-collector region of a lateral transistor extending between the first and second terminals;
   a buried layer of the second conductivity type located between the substrate and the first, second and third semiconductor regions; and
   a buried layer contact region of the second conductivity type extending from the buried layer to the surface to permit electrical contact to the buried layer.

6. The device of claim 3, further comprising:
   an ohmic connection extending between the second terminal and the buried layer contact region.

7. The device of claim 5, wherein:
   the second semiconductor region of the second conductivity type comprises a second highly doped contact region ohimcally coupled to the second surface terminal and a less highly doped will region of the second conductivity type underlying the second highly doped contact region; and
   further comprising a buried region of the first conductivity type located between the buried layer and the well region.

8. A semiconductor device, comprising:
   a semiconductor substrate of a first conductivity type;
   first and second surface terminals laterally spaced-apart on a surface above the semiconductor substrate;
   a first semiconductor region of the first conductivity type overlying the substrate and ohmically coupled to the first terminal;
   a second semiconductor region of a second opposite conductivity type overlying the substrate ohmically coupled to the second terminal and laterally arranged with respect to the first semiconductor region;
   a parasitic vertical device comprising the first semiconductor region and the substrate; and
   a third semiconductor region of the first conductivity type in proximity to the second semiconductor region and ohmically coupled to the second terminal, thereby forming in combination with the second semiconductor region a shorted base-collector region of a lateral transistor extending between the first and second terminals; wherein:

the first region of the first semiconductor type comprises a first highly doped contact region ohmically coupled to the first terminal and a less highly doped body region of the first conductivity type underlying the first highly doped contact region;

the second region of the second semiconductor type comprises a second highly doped contact region ohmically coupled to the second terminal and a less highly doped well region of the second conductivity type underlying the second highly doped contact region.

9. The device of claim 8, further comprising:

a buffer region of the second conductivity type underlying the second highly doped contact region and extending into the well region, and more highly doped than the well region.

10. A lateral device for providing diode action on a semiconductor substrate of a first conductivity type, comprising:

a buried layer of a second conductivity type different than the first conductivity type overlying the substrate;

further semiconductor regions overlying the buried layer and having a surface spaced apart from the buried layer;

a first contact region of the first conductivity type in the further semiconductor regions overlying the buried layer and extending to the surface;

a second contact region of the second conductivity type in the further semiconductor regions overlying the buried later, laterally disposed with respect to the first contact region, and extending to the surface;

a first terminal ohmically coupled to the first contact region;

a second terminal ohmically coupled to the second contact region;

a vertical parasitic device embodying the first contact region, a portion of the further semiconductor regions and the substrate;

a channel region of the first conductivity type separating the first and second regions at the surface;

a gate electrode overlying the channel region;

an isolation region extending downward from the surface between an edge of the gate electrode and a third semiconductor region; and a third contact region of the first conductivity type in the further semiconductor regions in proximity to the second contact region and ohmically coupled thereto and to the second terminal, thereby forming in cooperation with the second contact region a shorted base-collector region of a lateral transistor extending between the first and second terminals.

11. The device of claim 10 wherein:

the further semiconductor regions comprise:

a body region of the first conductivity type including the first contact region;

a well region of the second conductivity type including the second and third contact regions and laterally separated from the body region at the surface.

12. The device of claim 11, wherein the gate electrode is insulated from the surface, electrically coupled to the first terminal, and overlying the channel region, which separates the body region and the well region at the surface.

13. A lateral device for providing diode action on a semiconductor substrate of a first conductivity type, comprising:

a buried layer of a second conductivity type different than the first conductivity type overlying the substrate;

further semiconductor regions overlying the buried layer and having a surface spaced apart from the buried layer;

a first contact region of the first conductivity type in the further semiconductor regions overlying the buried layer and extending to the surface;

a second contact region of the second conductivity type in the further semiconductor regions overlying the buried later, laterally disposed with respect to the first contact region, and extending to the surface;

a first terminal ohmically coupled to the first contact region;

a second terminal ohmically coupled to the second contact region;

a vertical parasitic device embodying the first contact region, a portion of the further semiconductor regions and the substrate;

a third contact region of the first conductivity type in the further semiconductor regions in proximity to the second contact region and ohmically coupled thereto and to the second terminal, thereby forming in cooperation with the second contact region a shorted base-collector region of a lateral transistor extending between the first and second terminals; and a buried layer contact region of the same conductivity type as the buried layer, extending through the further semiconductor regions from the buried layer toward the surface.

14. The device of claim 13, further comprising:

an ohmic connection located on or above the surface and coupling the buried layer contact region to the second contact region.

15. The device of claim 13, wherein the buried layer contact region underlies and makes contact at least with the second contact region.

* * * * *